United States Patent
Ewing et al.

(10) Patent No.: US 10,348,063 B2
(45) Date of Patent: *Jul. 9, 2019

(54) METHOD AND APPARATUS FOR MULTIPLE INPUT POWER DISTRIBUTION TO ADJACENT OUTPUTS

(71) Applicant: Server Technology, Inc., Reno, NV (US)

(72) Inventors: Carrel W. Ewing, Reno, NV (US);
Andrew J. Cleveland, Reno, NV (US);
James P. Maskaly, Reno, NV (US)

(73) Assignee: Server Technology, Inc., Reno, NV (US)

( * ) Notice: Subject to any disclaimer, the term of this patent is extended or adjusted under 35 U.S.C. 154(b) by 39 days.

This patent is subject to a terminal disclaimer.

(21) Appl. No.: 15/233,137

(22) Filed: Aug. 10, 2016

(65) Prior Publication Data
US 2016/0352081 A1    Dec. 1, 2016

Related U.S. Application Data

(63) Continuation of application No. 14/083,570, filed on Nov. 19, 2013, now Pat. No. 9,419,416, which is a (Continued)

(51) Int. Cl.
*G06F 1/18*      (2006.01)
*H02B 1/06*      (2006.01)
(Continued)

(52) U.S. Cl.
CPC .............. *H02B 1/06* (2013.01); *G06F 1/189* (2013.01); *H01R 25/006* (2013.01); *H02B 1/015* (2013.01);
(Continued)

(58) Field of Classification Search
CPC ........ H02B 1/06; H02B 1/015; H05K 5/0247; H05K 5/0026; H05K 1/0298; H05K 13/00;
(Continued)

(56) References Cited

U.S. PATENT DOCUMENTS 6,220,880 B1   4/2001   Lee et al.
6,244,876 B1   6/2001   Saka
(Continued)

FOREIGN PATENT DOCUMENTS

CN   1420589 A   5/2003
CN   1643735 A   7/2005
(Continued)

OTHER PUBLICATIONS

Combined Search and Examination Report for United Kingdom Application No. GB1617920.2; dated Nov. 10, 2016; 4 pages.
(Continued)

*Primary Examiner* — Abhishek M Rathod
(74) *Attorney, Agent, or Firm* — Perkins Coie LLP

(57) ABSTRACT

Methods, systems, and apparatuses provide power from multiple input power sources to adjacent outputs efficiently and reliably. Aspects of the disclosure provide a power distribution unit (PDU) that includes a number of power outputs including first and second adjacent power outputs. The PDU includes a printed circuit board having a first conducting layer electrically interconnected to a first power input connection and the first power output, a second conducting layer that is at least partially above the first conducting layer and in facing relationship thereto. The second conducting layer is electrically insulated from the first conducting layer and electrically interconnected with a
(Continued)

second power input connection and the second power output, the first and second power outputs thereby connected to different power inputs.

28 Claims, 11 Drawing Sheets

Related U.S. Application Data continuation of application No. 13/149,658, filed on May 31, 2011, now Pat. No. 8,587,950.

(51) Int. Cl.
| | |
|---|---|
| H01R 25/00 | (2006.01) |
| H05K 1/02 | (2006.01) |
| H05K 1/14 | (2006.01) |
| H02B 1/015 | (2006.01) |
| H05K 1/11 | (2006.01) |
| H05K 13/00 | (2006.01) |
| H05K 5/00 | (2006.01) |
| H05K 5/02 | (2006.01) |

(52) U.S. Cl.
CPC ......... *H05K 1/0262* (2013.01); *H05K 1/0298* (2013.01); *H05K 1/115* (2013.01); *H05K 1/144* (2013.01); *H05K 5/0026* (2013.01); *H05K 5/0247* (2013.01); *H05K 13/00* (2013.01); *H05K 2201/042* (2013.01); *Y10T 29/4913* (2015.01); *Y10T 29/49117* (2015.01); *Y10T 29/49139* (2015.01)

(58) Field of Classification Search
CPC ...... H05K 1/115; H05K 1/0262; H05K 1/144; H05K 2201/042; G06F 1/189; H01R 25/006; Y10T 29/49117; Y10T 29/49139; Y10T 29/4913
See application file for complete search history.

(56) References Cited

U.S. PATENT DOCUMENTS

| | | | |
|---|---|---|---|
| 6,310,412 B1 | 10/2001 | Tamarkin | |
| 6,552,274 B1 | 4/2003 | Nakamura | |
| 6,674,006 B1 | 1/2004 | Linehan et al. | |
| 6,727,767 B2 | 4/2004 | Takada | |
| 7,400,493 B2 | 7/2008 | Ewing et al. | |
| 7,872,876 B2 | 1/2011 | Koo et al. | |
| 8,134,084 B2 | 3/2012 | Kawaguchi et al. | |
| 8,587,950 B2 | 11/2013 | Ewing et al. | |
| 2003/0227764 A1 | 12/2003 | Korczynski | |
| 2004/0011551 A1 | 1/2004 | Goehlich et al. | |
| 2004/0118602 A1 | 6/2004 | Lee et al. | |
| 2005/0093376 A1 | 5/2005 | Cleveland | |
| 2005/0094336 A1 | 5/2005 | Cleveland | |
| 2005/0205292 A1 | 9/2005 | Rogers et al. | |
| 2006/0050491 A1 | 3/2006 | Hayashi et al. | |
| 2006/0055022 A1 | 3/2006 | Nelson et al. | |
| 2006/0082983 A1 | 4/2006 | Parkhill et al. | |
| 2006/0092600 A1 | 5/2006 | Ewing et al. | |
| 2006/0284499 A1 | 12/2006 | Rubbo et al. | |
| 2007/0130243 A1 | 6/2007 | Ewing et al. | |
| 2007/0159775 A1 | 7/2007 | Ewing et al. | |
| 2007/0161293 A1 | 7/2007 | Ewing et al. | |
| 2008/0093927 A1 | 4/2008 | Ewing et al. | |
| 2008/0094210 A1 | 4/2008 | Paradiso et al. | |
| 2008/0135278 A1 | 6/2008 | Abe | |
| 2008/0272878 A1 | 11/2008 | Ewing et al. | |
| 2009/0234512 A1 | 9/2009 | Ewing et al. | |
| 2010/0084921 A1 | 4/2010 | Martins | |
| 2010/0118458 A1 | 5/2010 | Coffey | |
| 2010/0259871 A1 | 10/2010 | Ewing et al. | |
| 2010/0328849 A1 | 12/2010 | Ewing et al. | |
| 2012/0092811 A1 | 4/2012 | Chapel et al. | |
| 2012/0293520 A1 | 11/2012 | Yun et al. | |

FOREIGN PATENT DOCUMENTS

| | | |
|---|---|---|
| CN | 101071327 A | 11/2007 |
| EP | 1734644 A1 | 12/2006 |
| GB | 2503799 A | 1/2014 |
| JP | H0223176 | 9/1990 |
| JP | H10502519 A | 3/1998 |
| JP | 2002524999 | 8/2002 |
| JP | 2003-216283 A | 7/2003 |
| JP | 2007295754 A | 11/2007 |

OTHER PUBLICATIONS

International Search Report for International Application No. PCT/US2012/040185 dated Dec. 14, 2012 from Korean Intellectual Property Office.
Combined Search and Examination Report for United Kingdom Application No. GB1607040.1; dated Jun. 28, 2016; 4 pages.
Examination Report No. 1 for Australian Patent Application No. 2016023402; dated Sep. 28, 2017.
Examination Report No. 2 for Australian Patent Application No. 2016023402; dated Sep. 17, 2018; 4 pages.
Notice of Reasons for Rejection for Japanese Patent Application No. 2016-189945; dated Jun. 26, 2018; 6 pages.
Examination Report for Indian Application No. 3627/KOLNP/2013; dated Nov. 14, 2018; 6 pages.

METHOD AND APPARATUS FOR MULTIPLE INPUT POWER DISTRIBUTION TO ADJACENT OUTPUTS

CROSS-REFERENCE TO RELATED APPLICATION(S)

This application is a continuation of U.S. patent application Ser. No. 14/083,570, filed Nov. 19, 2013, entitled METHOD AND APPARATUS FOR MULTIPLE INPUT POWER DISTRIBUTION TO ADJACENT OUTPUTS, which is a continuation of U.S. patent application Ser. No. 13/149,658, filed May 31, 2011, now U.S. Pat. No. 8,587,950, entitled METHOD AND APPARATUS FOR MULTIPLE INPUT POWER DISTRIBUTION TO ADJACENT OUTPUTS, the entireties of which are incorporated herein by reference.

TECHNICAL FIELD

The present disclosure is directed to devices, systems and methods used in power distribution, power management, and power monitoring applications. More particularly, the present disclosure is directed to devices, systems and methods having the capability to provide adjacent outputs power from different power inputs.

BACKGROUND

Power distribution units have long been utilized to supply power to electronic equipment. A conventional power-distribution unit (PDU) is an assembly of multiple electrical "outlets" (also called "receptacles" or "outputs") that receive electrical power from a source and distribute the electrical power via the outlets to one or more separate electronic equipment units having respective power cords plugged into respective outlets of the PDU. In some applications, a PDU receives power from two different power inputs, commonly referred to as "dual feed" or "dual input" PDUs. Such dual inputs can provide additional power supply capability to a PDU, and/or may provide redundant sources of power for equipment that receives power from PDU outlets. PDUs can be used in any of various applications and settings such as, for example, in or on electronic equipment racks (such as RETMA racks) to provide power to network devices (e.g., servers, routers, gateways, network switches), among other applications. One or more PDUs located in a cabinet may for convenience be referred to as a Cabinet Power Distribution Unit (CDU).

Power distributed to small businesses or residential customers is commonly "single phase" or "dual phase" power. In a single phase system, a single alternating current with a sinusoidal voltage is distributed through a two-line connection. In a split phase system, two alternating voltages are distributed through at least three lines: one neutral line and one other line for each of the two phases. The two voltage waveforms voltages are separated in time by a "phase difference" of 180 degrees—that is, the sinusoidal form of the voltage on one line leads or lags the sinusoidal form of the voltage on the other line by the amount of the phase differential. The effective voltage between the first phase line and the second phase line is therefore significantly greater than the effective voltage between each of the phase lines and the neutral line. As a result, a three-line, split-phase system may provide, for example, 120 volts in a phase-to-neutral line circuit and 240 volts in a phase-to-phase line circuit.

In larger commercial and industrial applications, three phase systems may be employed. In three phase systems, each voltage cycle on each phase line is 120 degrees, or ⅓ of a period, out of phase with the voltage cycle on each of the other two phase lines. Three phase systems are used in large commercial and industrial applications because three-phase equipment is smaller in size, weighs less, and is more efficient than single or dual phase equipment. Although three phase circuits are somewhat more complex than single or dual phase circuits, they weigh less than single phase circuitry for the same loads supported by the circuitry. Three phase circuits also can provide a wide range of voltages and can be used for single or dual phase loads.

Three phase power is generated by circuits in either of two configurations: (i) a "delta"; or (ii) a "wye" configuration. If one end of each of the legs of a three-phase circuit is centrally connected at a common point and the other ends are connected to three phase lines (one line for each phase), the configuration is called a wye or "Y" connection. If the legs of the three phase circuits are connected instead in series to form a closed loop, with one phase line connected to each junction of two adjacent legs, the configuration is called a delta or "Δ" connection.

One reason that three phase circuits are more complex than typical single phase circuits is the need to maintain at least somewhat balanced loads among each of the three phases. One indicator of imbalance is the level of current flowing through each phase line. If the level of current flowing through a phase line is significantly different than that flowing through a different phase line, the load is considered to be unbalanced. In a wye connected system, imbalance can also be indicated by current flowing through the neutral line. Imbalance between the loads can result in damage to the three phase system, can cause excessive wear of components in the system such as the three-phase generator, can result in increased power usage, and can be difficult and costly to correct.

For example, high capacity data centers used in computer and communications network applications commonly utilize three-phase power for provide operating power to equipment located in hundreds or thousands of equipment racks within the data center. Commonly, three-phase power is supplied to the equipment racks via a four or five line input, providing a line for each voltage phase, an earth ground, and a neutral line for three-phase wye connections. A vertically, or horizontally, oriented power distribution unit connects to the input and distributes power of differing phases to a plurality of outputs for the phase. A three-phase PDU typically provides three or more branches of outputs, one branch for each phase of power provided by the three-phase plug strip. The PDU can be mountable on or adjacent to a given equipment rack in order to supply three or more branches single phase power (with each such branch derived from the three-phase power input) to the rack or other equipment in the vicinity.

SUMMARY

In various embodiments, a power distribution unit (PDU) is provided that comprises (a) a PDU housing; (b) a power input disposed at least partially within the housing comprising at least a first input connection electrically connectable to a first power source, and a second input connection electrically connectable to a second power source; (c) a plurality of power outputs disposed at least partially within the housing comprising at least a first power output and a second power output located adjacent to the first power output; and (d) a printed circuit board disposed in the housing comprising (i) a first conducting layer electrically interconnected to the first input connection and the first power output, and (ii) a second conducting layer that is located at least partially above the first conducting layer and in facing relationship thereto, electrically insulated from the first conducting layer, electrically interconnected with the second input connection, and electrically interconnected with the second power output, the first and second power outputs thereby connected to different power inputs.

In some embodiments, the printed circuit board further comprises a first conductively plated through hole extending through the first and second conducting layers, with the first conductively plated through hole being electrically connected to the first conducting layer, electrically insulated from the second conducting layer, and electrically interconnected to the first power output. The printed circuit board of such embodiments may further comprises a second conductively plated through hole extending through the first and second conducting layers, with the second conductively plated through hole electrically connected to the second conducting layer, electrically insulated from the first conducting layer, and electrically interconnected to the second power output.

The power input may further include a third power input connection electrically connectable to a third power source, in which case the power outputs include a third power output located adjacent to the second power output, and the printed circuit board further comprises a third conducting layer that is located at least partially above the first and second conducting layers, electrically insulated from the first and second conducting layers, electrically interconnected with the third input connection, and electrically interconnected with the third power output. With such a configuration the first, second, and third power outputs are thereby connected to different power inputs. The printed circuit board may comprise (1) a first conductively plated through hole extending through the first, second, and third conducting layers and being electrically connected to the first conducting layer, electrically insulated from the second and third conducting layers, and electrically interconnected to the first power output; (2) a second conductively plated through hole extending through the first, second, and third conducting layers and being electrically connected to the second conducting layer, electrically insulated from the first and third conducting layers, and electrically interconnected to the second power output; and (3) a third conductively plated through hole extending through the first, second, and third conducting layers and being electrically connected to the third conducting layer, electrically insulated from the first and second conducting layers, and electrically interconnected to the third power output.

In some embodiments, the power outputs comprise at least first and second groups of linearly arranged power outputs, adjacent outputs within each of the groups being interconnected to different power inputs. The PDU, in some embodiments, also includes a plurality of power control relays disposed in the housing, each among the plurality of power control relays being connected in independent power controlling communication between the power input and one of the power outputs. The PDU may also include a current-related information reporting system (e.g., at least one of current, voltage and power) disposed in the housing in current-related information determining communication with one or more of the power input and power outputs, and connectable in current-related information transfer communication with a separate communications network distal from the power distribution apparatus.

The power input to the PDU may comprise a first power input connected to a first power source and a second power input connected to a second power source, or may comprise a three phase power input where the first and second power sources correspond to different phases of the three phase power input.

Another aspect of the disclosure provides a printed circuit board apparatus for providing adjacent power outputs with power from different power inputs, comprising: (a) a first conducting layer comprising a first input connection configured to be connected to a first power input and a first output connection configured to be connected to a first power output; and (b) a second conducting layer located at least partially above the first conducting layer, preferably in facing relationship thereto, and electrically insulated from the first conducting layer. The second conducting layer comprises a second input connection configured to be connected to a second power input and a second output connection configured to be connected to a second power output.

The printed circuit board may include a first conductively plated through hole that extends through the first and second conducting layers and is electrically connected to the first conducting layer, and electrically insulated from the second conducting layer, and a second conductively plated through hole that extends through the first and second conducting layers and is electrically connected to the second conducting layer, and electrically insulated from the first conducting layer.

The printed circuit board may also include a third conducting layer located at least partially above the first and second conducting layers, and preferably in facing relationship thereto. The third layer is electrically insulated from the first and second conducting layers and comprises a third input connection configured to be connected to a third power input, and a third output connection configured to be connected to a third power output. In such embodiments, a first conductively plated through hole may extend through the first, second, and third conducting layers, be electrically connected to the first conducting layer, electrically insulated from the second and third conducting layers, and electrically interconnected to the first power output connection; a second conductively plated through hole may extend through the first, second, and third conducting layers, be electrically connected to the second conducting layer, electrically insulated from the first and third conducting layers, and electrically interconnected to the second power output connection; and a third conductively plated through hole may extend through the first, second, and third conducting layers, be electrically connected to the third conducting layer, electrically insulated from the first and second conducting layers, and electrically interconnected to the third power output connection.

Another aspect of the disclosure provides a method for providing power to adjacent power outputs from different power inputs in a power distribution unit, comprising: (a) connecting a first conducting layer of a printed circuit board to a first power input; (b) connecting a second conducting layer of the printed circuit board to a second power input, with the second conducting layer located at least partially above the first conducting layer and electrically insulated from the first conducting layer; (c) connecting a line power connection of a first power output to the first conducting layer; and (d) connecting a line power connection of a second power output adjacent to the first power output to the second conducting layer.

The method may also include connecting a third conducting layer of the printed circuit board to a third power input, with the third conducting layer located at least partially above the first and second conducting layers and electrically insulated from the first and second conducting layers; and connecting a line power connection of a third power output that is adjacent to one of the first and second power outputs to the third conducting layer.

Connecting the line power connection of the first power output to the first conducting layer may include connecting a first conductively plated through hole to the line power connection of the first power output, with the first conductively plated though hole extending through the first and second conducting layers, being electrically connected to the first conducting layer, and being electrically insulated from the second conducting layer. Connecting the line power connection of the second power output to the second conducting layer may include connecting a second conductively plated through hole to the line power connection of the second power output, with the second conductively plated though hole extending through the first and second conducting layers, being electrically connected to the second conducting layer, and being electrically insulated from the first conducting layer. The method may also include connecting a third conductively plated through hole to the line power connection of a third power output, with the third conductively plated though hole extending through a third conducting layer and the first and second conducting layers, and being electrically connected to the third conducting layer, and electrically insulated from the first and second conducting layers.

It is to be understood that the foregoing is a brief description of various aspects of various embodiments. It is therefore also to be understood that the scope of the invention is to be determined by the claims as issued and not by whether given subject matter includes any or all such features or advantages or addresses any or all of the issues noted herein.

In addition, there are other advantages and varying novel features and aspects of differing embodiments. The foregoing and other features and advantages will become more apparent from the following detailed description, which proceeds with reference to the accompanying figures.

BRIEF DESCRIPTION OF THE DRAWINGS

Several embodiments including the preferred embodiments and currently known best mode of the present invention are shown in the following description and accompanying drawings in which.

DETAILED DESCRIPTION

Embodiments of polyphase or multiple input power distribution, monitoring, and management devices, systems and methods are described herein. Embodiments of such devices and systems include a power distribution unit (PDU) with adjacent power outlets being provided with power from different power inputs through a power distribution printed circuit board. The present disclosure recognizes that properly balancing loads on different phases of a polyphase PDU is an important task that is complicated by different phases of power being traditionally provided to different groupings of outputs. Such different groups of outlets are generally located along the length of a PDU enclosure, and thus when adjacent components mounted in an equipment rack are required to be plugged into different phases, their respective power cables may need to be routed in non-ideal directions. Furthermore, in some cases cable management becomes a challenge due to excessive cable lengths and having to route cables to different outlet groups. The present disclosure provides groupings of outlets in which adjacent outlets are connected to different power phases. Traditionally, to provide adjacent outlets with power from different phases, separate physical wires would be required to be connected to the adjacent outlets. In cases where a relatively large number of outlets are present, such an assembly would require dozens of connection points each requiring manual connection during assembly. This would require a very labor intensive process to assemble the apparatus, with a corresponding increase in likelihood of manufacturing errors such as missed or improper connections, shorted connections, and/or resistive connections which can result in increased power usage and decreased reliability, not to mention the added costs attendant with such a configuration.

Embodiments of the present disclosure provide power to outlets through a power distribution printed circuit board interconnected to each power input phase. The circuit board allows for the provision of connection of different power input phases to adjacent outlets. The printed circuit board includes a number of layers of conductive material, with different layers connected to different input inputs or phases and to the line power connection of different power outlets. Such a printed circuit board provides a PDU that is significantly easier to manufacture and significantly more reliable relative to individual wired connections to each power outlet from different power inputs or phases.

Figure 1:
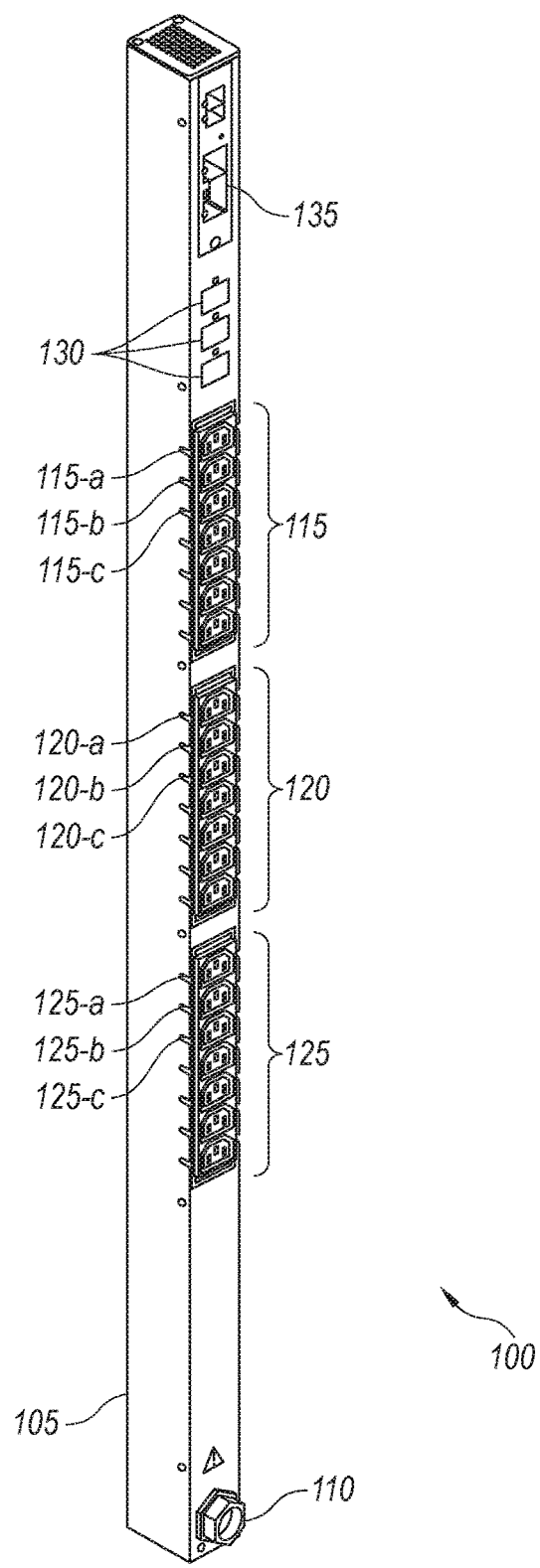
FIG. 1 is a front perspective view of a power distribution unit of an exemplary embodiment.

With reference to FIG. 1, an exemplary power distribution unit (PDU) 100 is described. The PDU 100 includes a housing 105 that is configured to be mounted vertically into an electronic equipment rack. As is well understood, such a vertically mountable PDU 100 may be mounted into an equipment rack at a rear portion of the equipment rack, thus consuming no vertical space in the equipment rack ("zero U") that would otherwise be used for computing equipment. The PDU 100 location at the back of the equipment rack allows power cords extending from the rear of the computing equipment to be conveniently plugged into the PDU 100. While a vertically mountable PDU 100 is illustrated in FIG. 1, the concepts and features described herein may be incorporated into power distribution devices having other form factors, such as horizontally mountable power distribution units, and power distribution devices for use in other applications. Accordingly, the particular devices and applications discussed herein are for representative purposes only.

A power input 110 penetrates the PDU housing 105 and may receive power input from multiple power phases, such as a three-phase power input. In other embodiments, power distribution units may include separate power inputs that each receive power from a different power source or power phase. The PDU 100 includes three groups, or banks, of power outlets 115, 120, 125, in this embodiment. Each group of power outlets 115, 120, 125, includes a number of individual power outlets such as power outputs 115-a, 115-b, and 115-c of power outlet group 115, power outlets 120-a, 120-b, and 120-c of power outlet group 120, and power outlets 125-a, 125-b, and 125-c of power outlet group 125. Individual power outlets 115-a, 115-b, and 115-c, are located adjacent to each other and in this embodiment are each interconnected to a different phase of the three phase power from power input 110. Similarly, power outlets 120-a, 120-b, 120-c, and 125-a, 125-b, 125-c, are located adjacent to each other and are each interconnected to a different phase of the three phase power from power input 110. Thus, adjacent outlets within a group of outlets 115, 120, 125, are connected to different phases of input power, thereby providing the capability to have components within an equipment rack that are directly located above or below one another to be plugged into power outlets having different power phases without having to route the power cord for the equipment to different groups or banks of outlets. Such a configuration provides for more convenient load balancing in a three phase system. Furthermore, cable management is simplified through providing different power inputs or phases within each outlet group along the length of a PDU.

The PDU 100 of this embodiment also includes a display 130 that may provide a visual display of information related to the current being provided through each of the phases or inputs of power to the PDU 100. Display 130 is preferably a digital display and may be numeric, alphabetic, pictorial, to name a few, or a combination of the foregoing, without limitation. In the embodiment of FIG. 1, the display 130 includes three separate displays, one for each input power phase, thus providing a real-time visual display of current for each phase that may assist in the balancing of loads on each of the input power phases. In some embodiments, each phase of power is provided as a separate power branch that has an associated circuit protection device, such as a circuit breaker or fuse. The display may also assist in determining the current level for each power phase or branch with respect to a maximum current level that the particular circuit or branch may be operated at without blowing a fuse or tripping a circuit breaker. The display 130 may also display other power related information, such as the voltage on respective phases, apparent power (measured in volt-amperes) being provided to each phase or branch, active, or real, power (measured in Watts) being provided to each phase or branch, and/or a power factor associated with each phase or branch, for example. The display 130 may include one or more seven segment LED displays, one or more LCD displays, or one or more touch screen displays, for example, that provide such power related information regarding each phase, branch, and/or power input. Such a display 130 however is not a requirement, and is therefore not present in various embodiments.

PDU 100 may be useable in a computer network, and may communicate over the computer network with a communications module 135. Communications module 135 in various embodiments communicates with a network power manager that may reside in a workstation or other remote device that is used in the management of a data center or other enterprise management system. The communications module 135 may include a network interface card (NIC) that has application firmware and hardware that interfaces to network the PDU 100 with the computer network. The communications module 135 may also be connected to one or more environmental sensors, and/or to one or more other PDUs. Similarly as with the display 130, a communications module is not required, and is not present in various embodiments.

The PDU 100 may include outlets 115, 120, 125, that are switchable to control the application of power from the input power to a corresponding power output. The PDU 100 may also provide power state sensing and/or load-sensing with respect to the corresponding power outlets. In some embodiments, load sensing information for the different inputs and/or outlets is reported over a network through a communications module 135 as described above.

Figure 2:
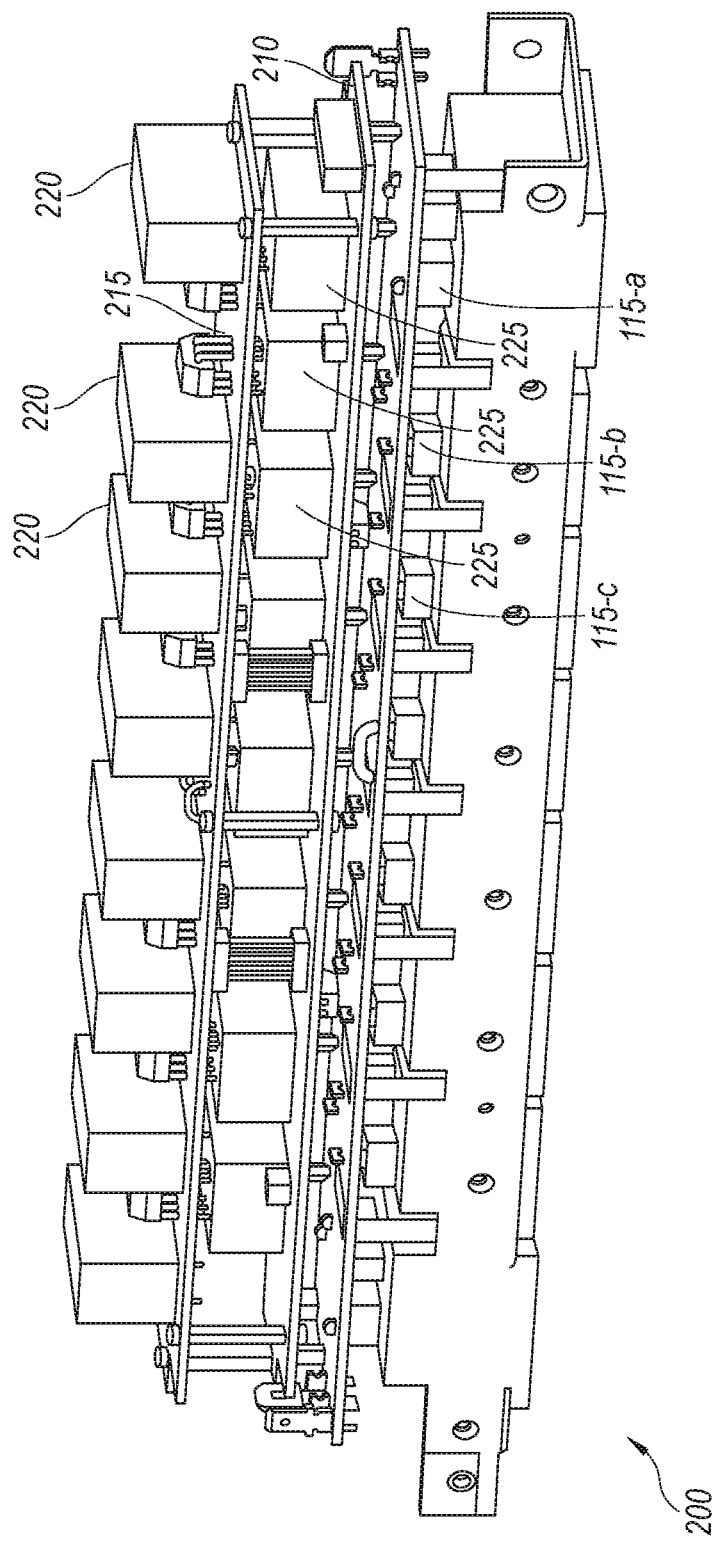
FIG. 2 is an illustration of a group of outputs and associated printed circuit boards according to an exemplary embodiment.

With reference now to FIG. 2, a group of outlets 200 is illustrated. The group of outlets 200 in this embodiment are arranged in a modular fashion, and may be referred to as an intelligent power module. In the embodiment of FIG. 2, various circuitry associated with the power outlets are contained on a number of interconnected printed circuit boards. In this embodiment, power from the power inputs is provided to power outlets 115-a, 115-b, 115-c through a lower printed circuit board 205. The first (lower) circuit board 205 is constructed to provide adjacent outlets 115-a, 115-b, and 115-c with power from different power inputs or phases. The construction of lower circuit board 205 will be described in more detail below. A second (middle) circuit board 210 and a third (upper) circuit board 215 are interconnected to lower circuit board 205. In this embodiment upper circuit board 215 includes a plurality of power control relays 220 that work to control the application of power to an associated output 115-a, 115-b, 115-c. In the embodiment of FIG. 2, the middle circuit board 210 includes power sensing components that sense and report power-related information associated with each power output 115-a, 115-b, 115-c, including current sensing transformers 225 for each output in this embodiment. The electrical connections of each of the circuit boards may be designed such that the boards may be assembled with related inputs/outlets and connections that are aligned so as to provide for efficient modular assembly of power outlet modules that incorporate some or all of the features described herein through the addition of one or more related printed circuit boards.

In various embodiments, the middle and upper circuit boards 210, 215, may not be present, depending upon the particular application of the PDU. In other embodiments, one or more of middle and upper circuit boards 210, 215, are present, depending upon the particular application of the PDU. In other embodiments, various different components of an outlet module 200 may be assembled onto the separate circuit boards that are then assembled into a power outlet module. In such a manner, component boards may be assembled to include features that are ordered by a particular customer or user of a PDU in which the outlet module will be used. Furthermore, a user or customer may desire some, but not all, of the outlets in a PDU to have one or more functions, such as switching and current reporting, and thus different outlet modules, or subsets of outlets in an outlet module, may be assembled with the additional component boards to provide such capability. Such a configuration provides flexible and efficient manufacturing options while maintaining high reliability.

Figure 3:
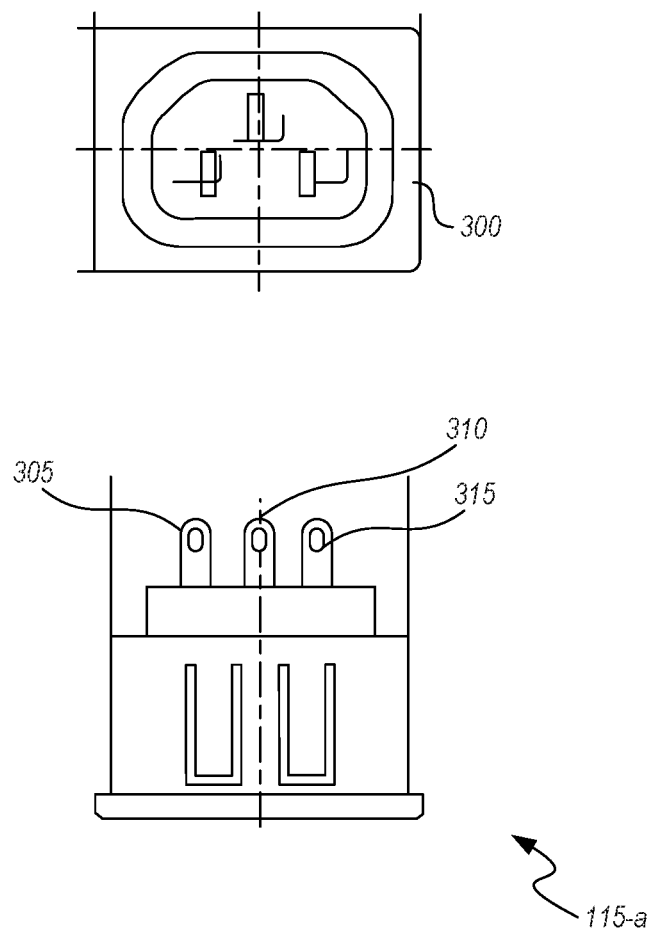
FIG. 3 is an illustration of an output receptacle of an exemplary embodiment.

In one embodiment, the power outlet module 200 includes eight outlets 300, each of IEC-C13 type, such as illustrated in FIG. 3. In this embodiment, each outlet 300 is a "snap-in" type of outlet that includes a line connector 315, a neutral connector 305, and a ground connector 310. The outlets 300 are assembled into the module housing with the outlet connectors 305, 310, 315 connecting with corresponding openings in lower printed circuit board 205. Thus the module 200 may be assembled in a relatively efficient and reliable manner. It will be understood that this embodiment, and other embodiments described herein as having IEC-C13 type outlets, are exemplary only and that any of various other types of outlets alternatively can be used. For example, the "outlets" can be other NEMA types (e.g., NEMA 5-15R, NEMA 6-20R, NEMA 6-30R or NEMA 6-50R) or any of various IEC types (e.g., IEC C19). It also will be understood that all the "outlets" in a particular power outlet module 200, or other outlet modules, need not be identical. It also will be understood that the "outlets" are not limited to three-prong receptacles; alternatively, one or more of the "outlets" can be configured for two or more than three prongs in the mating male connector. It also will be understood that the "outlets" are not limited to having female prong receptacles. Further, while outlet module 200 of this embodiment includes eight outlets, it will be understood that this is but one example and that an outlet module may include a different number of outlets.

Figure 4:
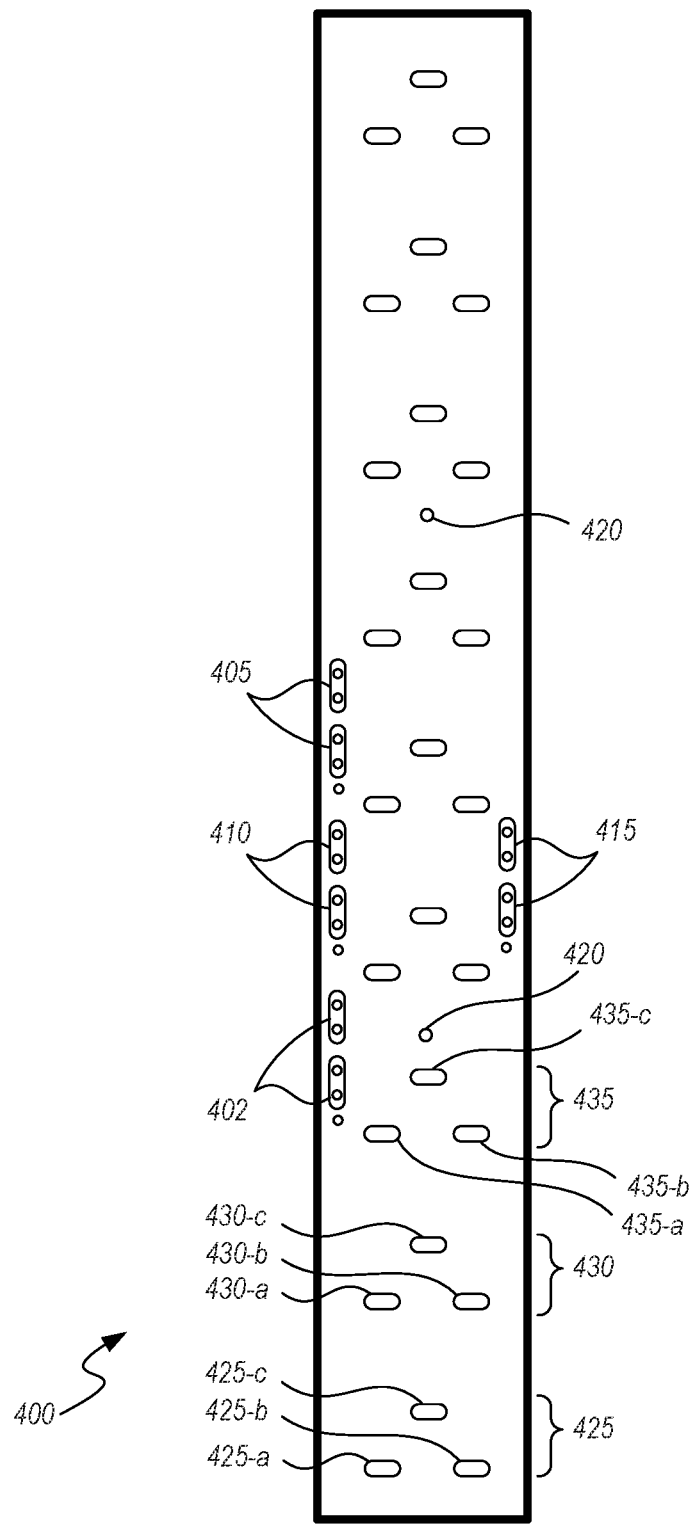
FIG. 4 is an illustration of a printed circuit board that provides outputs with power from different inputs according to an exemplary embodiment.

Lower circuit board 205, as mentioned above, provides power to each of the power outputs, such as outlets 300. With reference now to FIG. 4, a lower circuit board 400 according to an embodiment is described in more detail. In this embodiment, board 400 includes power inputs for each power phase in a three phase power input, the three phases referred to as phase X, phase Y, and phase Z. A first input 402 is connectable to the phase X input, a second input 405 is connectable to the phase Y input, and a third input 410 is connectable to the phase Z input. A fourth input 415 is connectable to a neutral line. The circuit board 400 also includes inputs 420 connectable to a ground connection. The circuit board 400 includes a number of sets of connectors 425, 430, 435, that are spaced and sized to receive connectors 305, 310, and 315 of an outlet 300. For example, connector set 425 includes a line connection 425-*a* that is arranged to receive line connector 315 of outlet 300, a neutral connection 425-*b* that is arranged to receive neutral connector 305 of outlet 300, and a ground connector 425-*c* that is arranged to receive ground connector 310 of outlet 300. In this embodiment, each line connector 425-*a*, 430-*a*, and 435-*a* connects to a different phase of power input, with line connector 425-*a* connected to phase X, connector 430-*a* connected to phase Y, and connector 430-*a* connected to phase Z. Thus, adjacent power outputs are connected to a different power input. Using a printed circuit board 400 to achieve such connections significantly reduces the manufacturing complexity of providing such a PDU, as compared to a PDU in which individual wires would be connected to each adjacent power output.

Using printed circuit board 400 also provides enhanced reliability as compared to individual wire connections, due to more reliable connections between outlet 300 and printed circuit board 400. As is understood, when connections between power supplying components are not properly connected, such as through loose mating discrete wire connectors and/or improper crimping of wires, the connection may have additional resistance, and is referred to as an ohmic connection. Ohmic connections can provide significant reliability and safety issues, due to heating of such connections and a significantly higher likelihood of failure due to the heating. Using a printed circuit board 400, such as described, significantly reduces the likelihood of such problematic connections.

Figure 5:
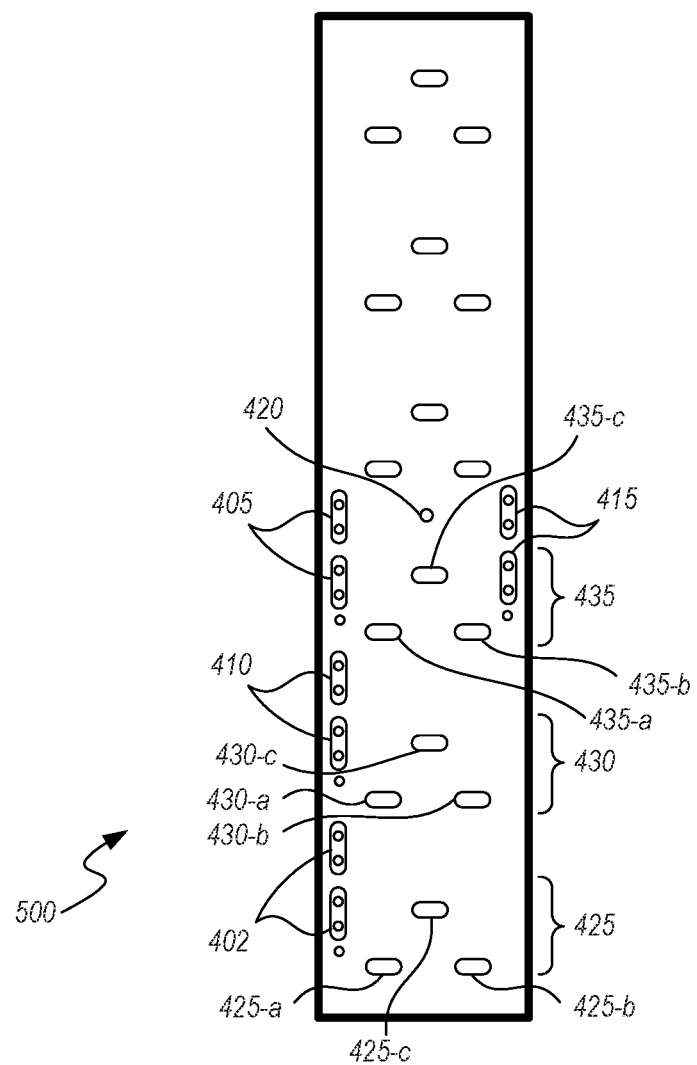
FIG. 5 is an illustration of a printed circuit board that provides outputs with power from different inputs according to another exemplary embodiment.

As described, board 400 includes connections for nine outlets 300. In this manner, three outlets are connected to each phase in an alternating fashion, namely a first outlet connected to phase X, a second outlet connected to phase Y, a third outlet connected to phase Z, and so on through the ninth outlet. In other embodiments, different numbers of outputs may be present, such as printed circuit board 500 illustrated in FIG. 5. Such a printed circuit board 500 contains similar connections as printed circuit board 400, and simply has a reduced number of outputs.

In some embodiments, each power input phase has an associated circuit protection device, such as a circuit breaker or fuse. In some embodiments, all of the outlets and circuit protection devices associated with a particular power phase are color coded on the housing of the PDU. Thus, all of the outlets and circuit protection device associated with phase X may have a first color, all of the outlets and circuit protection device associated with phase Y may have a second color, and all of the outlets and circuit protection device associated with phase Z may have a third color. In such a manner, a particular outlet and/or circuit protection device may be easily identified with the corresponding power phase. Similarly, in embodiments that include a display, the display may include corresponding color coding to identify the particular power phase for which power-related information is being displayed. In other embodiments, different numbers of phases or power inputs may be supplied to the PDU, with corresponding changes to the printed circuit boards and/or color coding that will be readily apparent to one of skill in the art.

Figure 6:
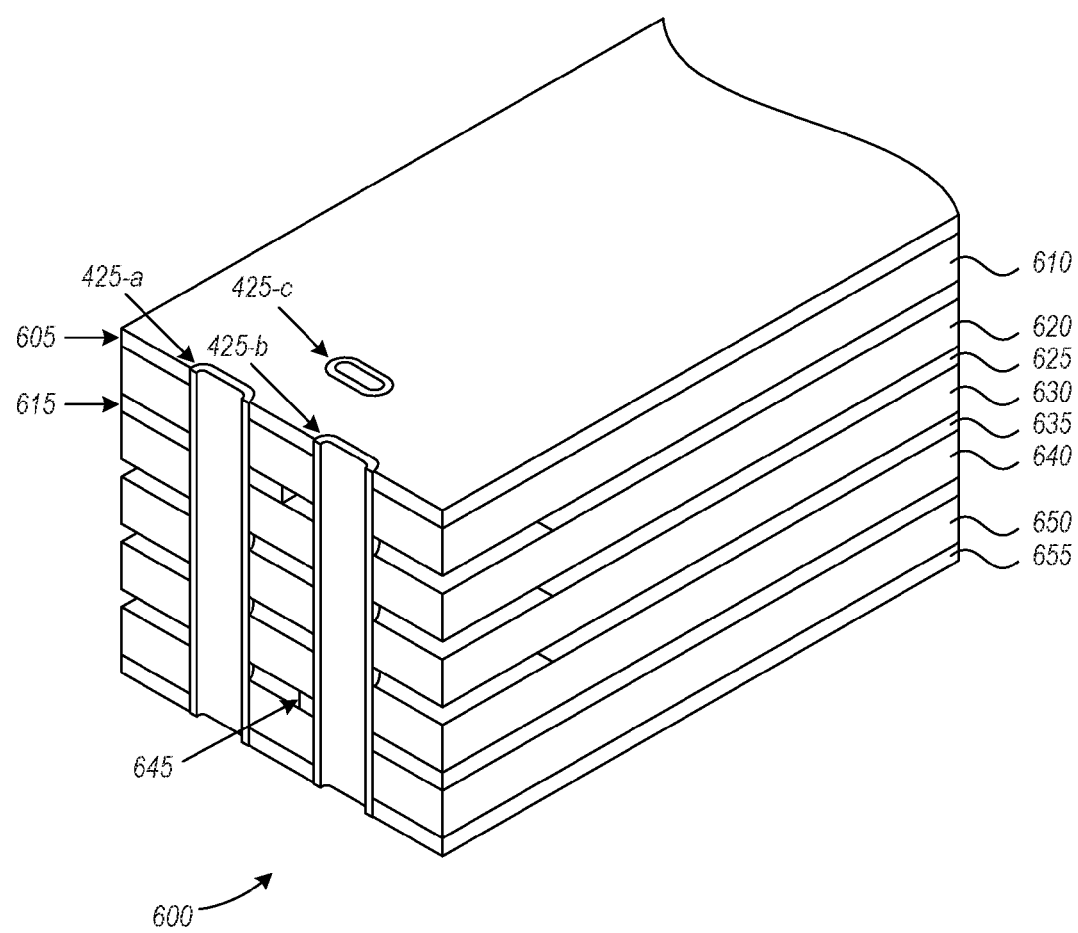
FIG. 6 is a perspective view illustration, partially in cross section, of a printed circuit board that provides outputs with power from different inputs according to an exemplary embodiment.

With reference now to FIG. 6, a representation of a circuit board 600 of an embodiment is discussed. The circuit board 600 (not to scale) is illustrated partially in cross-section and illustrates the number of layers that are present in the printed circuit board 600. Such a construction may be used in circuit boards 205, 400 and 500, for example. The printed circuit board 600 is made of a number of alternating layers of conductors and insulators. The circuit board 600 is fabricated to have a number of interleaved conducting and insulating layers, with the various conducting layers in facing relationship to other of the conducting layers and thereby forming a circuit board 600 having a compact sandwiched-type configuration of alternating conducting and insulating layers. A top layer 605 in this embodiment includes both conductors and insulative material that provides circuit connections and electrical insulation, and a protective coating for the printed circuit board 600. A first insulating layer 610 is located beneath the top layer 605, and provides electrical insulation between the top layer and first conducting layer 615. The first inner conducting layer 615, in this embodiment, includes three electrically insulated conductive portions, one of which is connected to the phase input corresponding to phase X and the other two that are ground connections. A second insulating layer 620 is located beneath the first conducting layer 615, and provides electrical insulation between the first conducting layer and second conducting layer 625. The second inner conducting layer 625, in this embodiment, includes three electrically insulated conductive portions, one of which is connected to the phase input corresponding to phase Y and the other two that are ground connections. A third insulating layer 630 is located beneath the second conducting layer 625 and provides electrical insulation between the second conducting layer 625 and third conducting layer 635. The third inner conducting layer 635 in this embodiment includes three electrically insulated conductive portions, one of which is connected to the phase input corresponding to phase Z and the other two are ground connections. A fourth insulating layer 640 is located beneath the third conducting layer 635 and provides electrical insulation between the third conducting layer 635 and fourth conducting layer 645. The fourth inner conducting layer 645 in this embodiment is connected to the neutral input. A fifth insulating layer 650 is located beneath the fourth conducting layer 645 and provides electrical insulation between the fourth conducting layer 645 and a bottom layer 655. The bottom layer 655 in this embodiment includes both conductors and insulative material that provides circuit connections and electrical insulation, and a protective coating for the printed circuit board 600. The printed circuit board 600 also has a plurality of conductively plated through holes that correspond to a line connection 425-*a* that is arranged to receive line connector 315 of outlet 300, a neutral connection 425-*b* that is arranged to receive neutral connector 305 of outlet 300, and a ground connector 425-*c* that is arranged to receive ground connector 310 of outlet 300. As will be readily understood, the circuit board 600 includes conductively plated through holes that correspond to other outlets.

Figure 7:
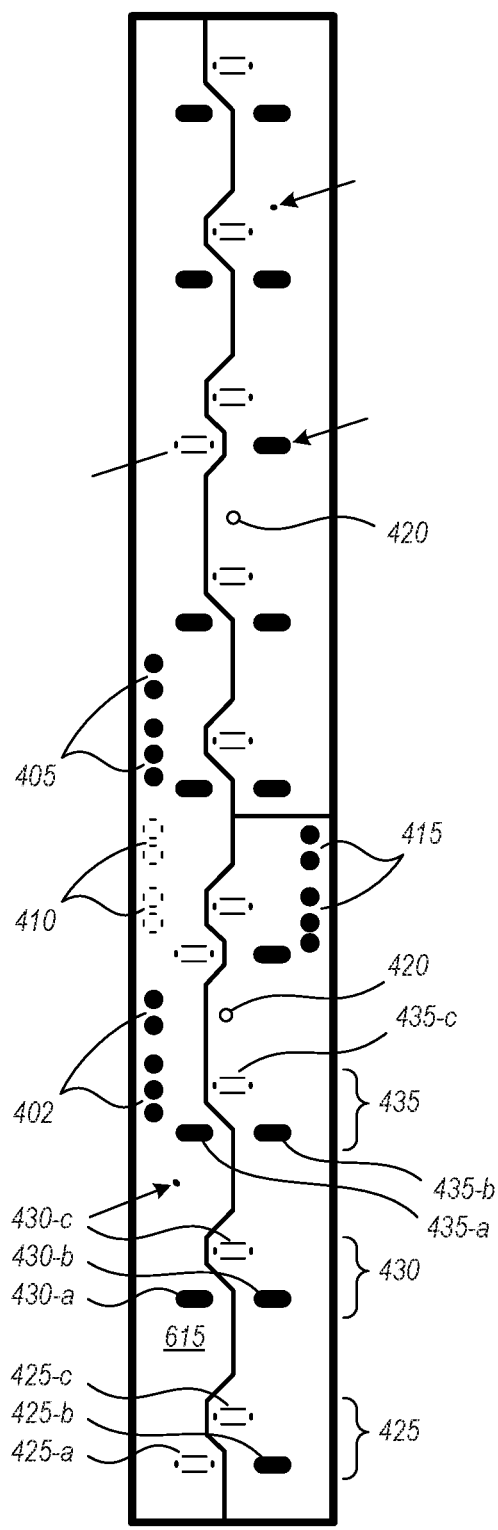
FIG. 7 illustrates conducting material of a conducting layer of a printed circuit board that provides outputs with power from one of several power inputs according to an exemplary embodiment.
Figure 8:
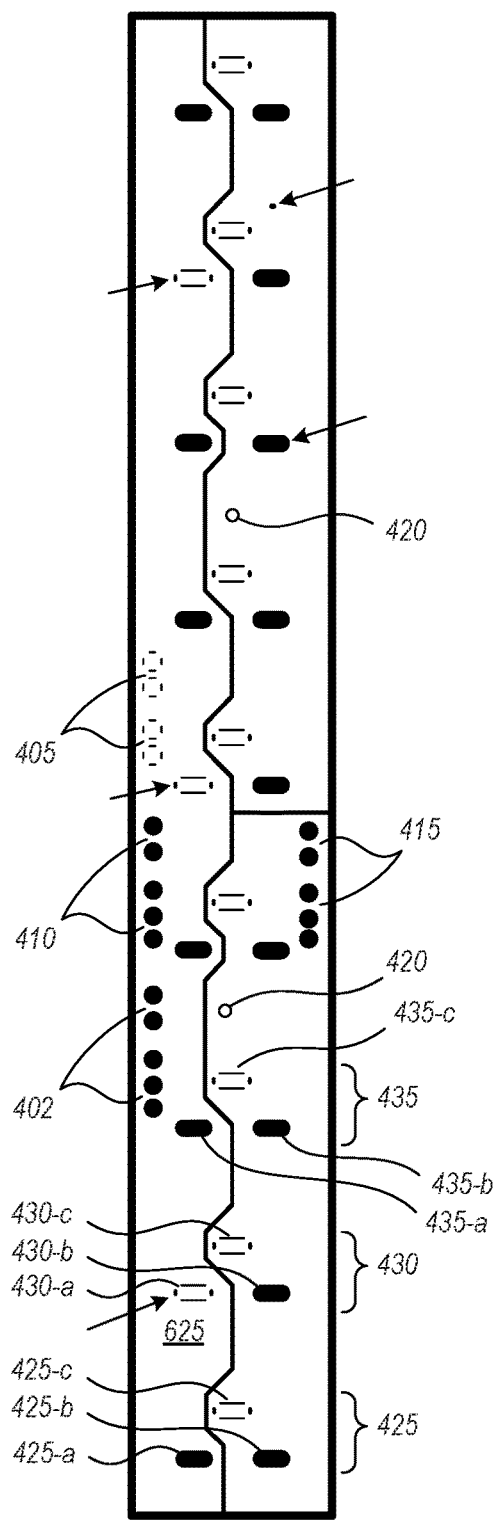
FIG. 8 illustrates conducting material of another conducting layer of a printed circuit board that provides outputs with power from one of several power inputs according to an exemplary embodiment.
Figure 9:
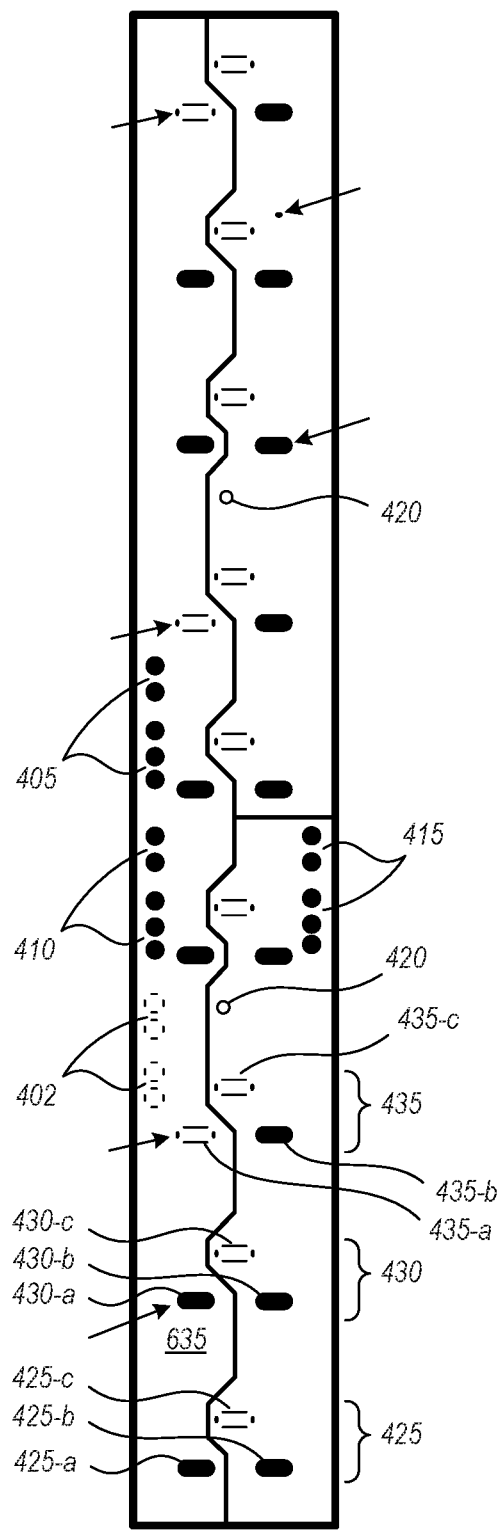
FIG. 9 illustrates conducting material of yet another conducting layer of a printed circuit board that provides outputs with power from one of several power inputs according to an exemplary embodiment.

The conductive layers 605, 615, 625, 635, 645, and 655 include voids in conductive material, such as copper, around through holes that are not to be electrically connected to the particular conductive layer. FIGS. 7-9 illustrate different conductive layers 615 (FIG. 7), 625 (FIG. 8), and 635 (FIG. 9). Taking conductive layer 615 of FIG. 7 as an example, the conductive layer of this embodiment includes a copper conductor, denoted by the light areas, and voids in conductor material denoted by dark areas of FIG. 7. The voids are placed such that the conductive layer 615 does not contact the plated through holes corresponding to outputs that are not to be connected to the particular phase input of the conducting layer. Thus, in the example of FIG. 7, conductive material is present at the input 410 for the polyphase phase Z input, and at the line connection 425-*a* of the output 425. The layer 615 includes voids around the line connections 430-*a* and 435-*a* of outputs 430 and 435, respectively. In this manner, the conductively plated through hole associated with line connection 425-*a* is electrically connected to the phase Z input 410, while the line connections 430-*a* and 435-*a* of outputs 430 and 435 are electrically insulated from the phase Y input 402. Conducting layer 615 includes a line side and a ground sides, that are electrically insulated. The ground side of layer 615 has conductive material present at the ground connections for each of the outputs, and has voids associated with the through holes corresponding to the neutral connections of each output. FIG. 8 illustrates conductive layer 625 and connections to the phase Y input in a similar manner. FIG. 9 illustrates conductive layer 635 and connections to the phase X input in a similar manner.

While the embodiments of FIGS. 4-9 illustrate multiple power phase connections in a "wye" type configuration, where outputs are connected between a particular power phase and a neutral line, similar constructions may be used to provide outputs that are connected to multiple power phases in a "delta" type configuration. In such embodiments, the conducting layers for different power phase inputs are simply extended to overlap with both of the non-ground power inputs of a corresponding power output. The conducting layers corresponding to the different power phases are provided with corresponding electrical insulation (such as through above-described voids) and connections to conductively plated through holes for the power output connections. Thus, the conductively plated through holes for a particular power output may be selectively connected to the two appropriate input power phases to provide a power output that is connected phase-to-phase, rather than phase-to-neutral.

Figure 10:
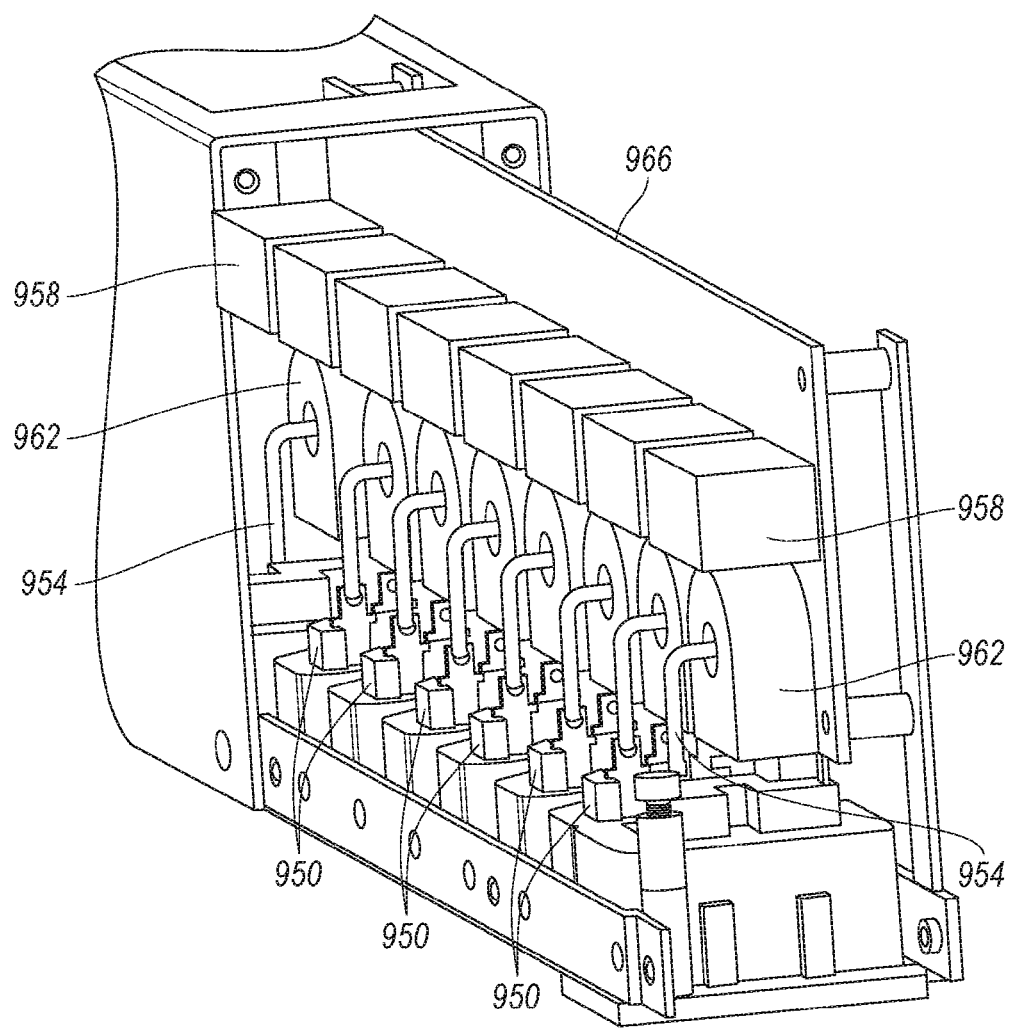
FIG. 10 is an illustration of a group of outputs and associated printed circuit board that provides outputs with power from different inputs according to another exemplary embodiment.

Accordingly, described are printed circuit boards that may be used to provide adjacent power outputs with power from different power inputs without requiring complex wiring harnesses and a large number of individual wired connections. Outlets, such as outlet 300 of FIG. 3, may have connectors inserted into corresponding through holes in the exemplary printed circuit boards and be electrically connected to the appropriate electrical connections. Of course, the concepts of the printed circuit boards described herein may be applied to printed circuit boards that also include other components as well. FIG. 10 illustrates an example of a printed circuit board 966 that incorporates the multiple conductive layers as described above, to provide adjacent outlets 950 with power from different power inputs. In this embodiment, the line power is provided to outlets 950 through a line connection 954 that is routed through a relay 958 and an associated current transformer 962. The relays 958 and current transformers 962 are interconnected to control and monitoring circuitry such as described above. In this embodiment, the printed circuit board 966 is mounted at a 90 degree angle relative to the plane of the outlets 950. In this manner, the additional surface area required by the circuit board 966 is provided in a plane that is generally perpendicular to the plane of the outlets 950, rather than in a parallel plane as illustrated in the embodiment of FIG. 2. By configuring the circuit board 966 perpendicular to the plane of the outlets 950, this additional surface area can be accommodated simply be making the PDU housing somewhat deeper, with the width of the housing remaining substantially the same as the embodiment of FIG. 1. Using a single printed circuit board 966 allows a reduced manufacturing cost and provides efficiencies in manufacturing due to reduced assembly steps relative to embodiments with more than one printed circuit board.

Figure 11:
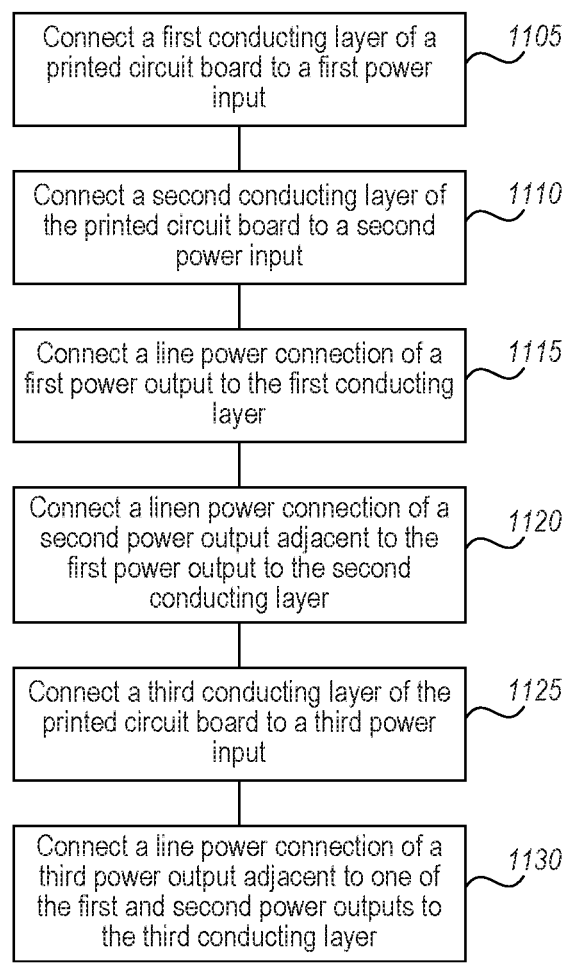
FIG. 11 is a flow chart illustration of a method for providing power from multiple inputs to adjacent outputs in a PDU.

As noted in several of the above-described embodiments, power from multiple inputs may be distributed through a printed circuit board that is fabricated with interspersed or interleaved conductive and insulating layers in a sandwiched relationship to have the characteristics discussed in the above embodiments. With reference now to FIG. 11, a flow chart illustration of an exemplary method 1100 for providing power to adjacent power outputs from different power inputs in a power distribution unit is described, which may employ such a sandwiched printed circuit board. In this embodiment, as noted at block 1105, a first conducting layer of a printed circuit board is connected to a first power input. At block 1110, a second conducting layer of the printed circuit board is connected to a second power input. The second conducting layer in various embodiments is located at least partially above the first conducting layer in a facing relationship thereto, and is electrically insulated from the first conducting layer. A line power connection of a first power outlet is connected to the first conducting layer, according to block 1115. A line power connection of a second power outlet adjacent to the first power outlet is connected to the second conducting layer, as noted at block 1120. A third conducting layer of the printed circuit board is connected to a third power input at block 1125. Similarly as above, the third conducting layer is located at least partially above the first and second conducting layers and electrically insulated from the first and second conducting layers. At block 1130 a line power connection of a third power outlet adjacent to one of the first and second power outlets is connected to the third conducting layer. According to some embodiments, connecting the line power connection of the first power outlet to the first conducting layer comprises connecting a first conductively plated through hole to the line power connection of the first power output, the first conductively plated though hole extending through the first and second conducting layers, electrically connected to the first conducting layer, and electrically insulated from the second conducting layer. Similarly, the connecting a line power connection of the second and third power outlets to the second and third conducting layers may comprise, respectively, connecting second and third conductively plated through holes to the line power connection of the second and third power outlets. The second and third conductively plated though holes extending through each of the conducting layers and being electrically connected to the second and third conducting layers, respectively. Each conductively plated through hole is electrically insulated from the other conducting layers, in a manner similarly as described above. Of course, it will be readily recognized that the steps of method 1100 are exemplary in nature, and numerous variations of the order of steps, additional stems, of fewer steps, may be present in various embodiments. For example, if power from dual power inputs is desired to be connected to alternating adjacent power outlets in a PDU, the sandwiched printed circuit board may include conducting layers for each of the dual power inputs, with line power connections of adjacent outlets connected to the appropriate conducting layers.

As will be readily recognized from the above described embodiments, the present disclosure provides efficient and reliable output of power from multiple power inputs to adjacent power outputs. It can thus be seen that the foregoing and other embodiments, or aspects thereof, can variously provide one or more among the following problem solutions, advantages, or benefits:

efficient manufacturing and assembly of power distribution units having groups of linearly arranged power outlet with adjacent power outputs connected to different power sources;

lower cost PDUs having the above-described features through reduction of materials required to manufacture and assemble such PDUs;

lower cost PDUs having the above-described features through reduction of assembly steps required to assemble such PDUs;

PDUs having higher reliability due to reduced likelihood of manufacturing errors and/or resistive connections between adjacent outlets having different power source inputs;

efficient load balancing between phases of polyphase PDUs;

in dual input PDUs, equipment having internal redundant power supplies requiring connection to redundant power sources may be connected to adjacent outlets in a PDU, simplifying cable management;

PDUs with multiple groups of power outlets with options for connecting adjacent components in an equipment rack to adjacent outputs of the PDU, rather than to outlets in different outlet groups, thereby simplifying cable management; and PDUs having one or more of the above-noted features in a compact form factor that consumes zero units of equipment rack space.

The previous description of the disclosure is provided to enable a person skilled in the art to make or use the disclosure. Various modifications to the disclosure will be readily apparent to those skilled in the art, and the generic principles defined herein may be applied to other variations without departing from the spirit or scope of the disclosure. Throughout this disclosure the term "example" or "exemplary" indicates an example or instance and does not imply or require any preference for the noted example. Thus, the disclosure is not to be limited to the examples and designs described herein but is to be accorded the widest scope consistent with the principles and novel features disclosed herein.

We claim:

1. A power distribution apparatus adapted for use with a 3-phase power source that includes a first phase line conductor, a second phase line conductor, a third phase line conductor, a neutral line conductor and a ground conductor, said power distribution apparatus comprising:

a housing;

a power input disposed at least partially within the housing and connectable to the 3-phase power source;

a multi-layer printed circuit board (PCB) disposed in said housing and electrically connected to said power input, said PCB comprising a plurality of layers with electrically conductive material, including:

a first conducting layer;

a second conducting layer; and a third conducting layer, wherein each of the first, second and third conducting layers is electrically connectable to only one phase line conductor when said input is connected to the 3-phase power source;

a plurality of power outputs disposed at least partially within the housing, comprising:

at least a first power output electrically connectable to the first phase line conductor via said first conducting layer;

at least a second power output located adjacent to the first power output and electrically connectable to the second phase line conductor via said second conducting layer; and at least a third power output located adjacent the second power output, and electrically connectable to the third phase line conductor via said third conducting layer.

2. The power distribution apparatus of claim 1, wherein said at least a first power output, said at least a second power output and said at least a third power output define a multi-phase outlet group that extends lengthwise along said housing such that longitudinally adjacent outlets within the multi-phase outlet group are electrically connectable to a different phase line conductor when said power input is connected to the 3-phase power source.

3. The power distribution apparatus of claim 2, comprising a plurality of multi-phase outlet groups extending longitudinally adjacent to one another along said housing, each of said multi-phase outlet groups comprising an associated first power output, second power output and third power output.

4. The power distribution apparatus of claim 1, wherein said at least a first power output, at least a second power output and at least a third power output are configured as outlet receptacles that are mounted to said multi-layer PCB to define an outlet module.

5. The power distribution unit of claim 1, wherein each of said at least a first power output, at least a second power output and at least a third power output is configured as an outlet receptacle and comprises an associated line connector electrically connected to the outlet's respective conducting layer.

6. The power distribution unit of claim 5, wherein each of said at least a first power output, at least a second power output, and at least third power output further comprises an associated neutral connector and ground connector.

7. The power distribution unit of claim 6, wherein said multi-layer PCB includes at least one ground conducting region electrically connected to the ground connector of each outlet, and at least one neutral conducting region electrically connected to the neutral conductor of each outlet.

8. The power distribution unit of claim 7, wherein said multi-layer PCB further comprises a first conductively plated through hole extending through the first, second and third conducting layers, said first conductively plated through hole electrically connected to the first conducting layer, electrically insulated from the second and third conducting layers, and electrically interconnected to the at least a first power output.

9. The power distribution unit of claim 8, wherein said multi-layer PCB further comprises a second conductively plated through hole extending through the first, second and third conducting layers, said second conductively plated through hole electrically connected to the second conducting layer, electrically insulated from the first and third conducting layers, and electrically interconnected to the at least a second power output.

10. The power distribution unit of claim 9, wherein said multi-layer PCB further comprises a third conductive plated through hole extending through the first, second and third conducting layers, said third conductively plated through hole electrically connected to the third conducting layer, electrically insulated from the first and second conducting layers, and electrically interconnected to the at least a third output.

11. The power distribution unit of claim 10, wherein said multi-layer PCB further comprises at least a first input connection, at least a second input connection, and at least a third input connection each electrically connectable, respectively, to the first, second and third line conductors when said power input is electrically connected to the 3-phase power source.

12. The power distribution unit of claim 1, wherein said first, second and third conducting layers are electrically insulated from one another.

13. The power distribution unit of claim 12, wherein said multi-layer PCB includes a plurality of insulation layers interposed between adjacent, facing ones of said first, second and third conducting layers.

14. The power distribution unit of claim 1, further comprising a plurality of power control relays disposed in said housing, each among the plurality of power control relays being connected in independent power control communication between said power input and a respective power output.

15. The power distribution unit of claim 1, wherein at least one of said first, second and third conducting layers includes a plurality of conductive regions that are electrically insulated from one another, and wherein at least one of said plurality of conductive regions is electrically connectable to a respective phase line conductor, and another of said plurality of conductive regions is electrically connectable to either the neutral line conductor or the ground conductor when said power input is electrically connected to the 3-phase power source.

16. A power module, comprising:
an elongate multi-layer printed circuit board (PCB) comprising:
a first conducting layer;
a second conducting layer located at least partially below the first conducting layer in facing relationship thereto, and electrically insulated from the first conducting layer; and
a third conducting layer located at least partially below the first and second conducting layers in facing relationship thereto, and electrically insulated from the first and second conducting layers;
at least one outlet group extending lengthwise along said elongate multi-layer PCB such that longitudinally adjacent outlets within said at least one outlet group are connected to different conducting layers, said at least one outlet group, comprising:
at least a first power outlet mounted on said PCB, and having an associated first power outlet line connector electrically connected to said first conducting layer;
at least a second power outlet mounted on said PCB, and having an associated second power outlet line connector electrically connected to said second conducting layer; and
at least a third power outlet mounted on said PCB, and having an associated third power outlet line connector electrically connected to said third conducting layer.

17. The power module of claim 16, wherein said multi-layer PCB further comprises at least a first input connection, at least a second input connection, and at least a third input connection each electrically connectable, respectively, to the first, second and third conducting layers.

18. The power module of claim 17, wherein said multi-layer PCB further comprises a first conductively plated through hole extending through the first, second and third conducting layers, said first conductively plated through hole electrically connected to the first conducting layer, and electrically insulated from the second and third conducting layers, and wherein the first conductively plated through hole receives a line connector associated with the at least a first power outlet and electrically interconnects the at least a first power outlet to the first input connection.

19. The power module of claim 18, wherein said multi-layer PCB further comprises a second conductively plated through hole extending through the first, second and third conducting layers, said second conductively plated through hole electrically connected to the second conducting layer, and electrically insulated from the first and third conducting layers, and wherein the second conductively plated through hole receives a line connector associated with the at least a second power outlet and electrically interconnects the at least a second power outlet to the second input connection.

20. The power module of claim 19, wherein said multi-layer PCB further comprises a third conductive plated through hole extending through the first, second and third conducting layers, said third conductively plated through hole electrically connected to the third conducting layer, and electrically insulated from the first and second conducting layers, and wherein the third conductively plated through hole receives a line connector associated with the at least a third power outlet and electrically interconnects the at least a third power outlet to the third input connection.

21. The power module of claim 20, wherein each power outlet in said power outlet group is configured as a receptacle that is mounted to said multi-layer PCB.

22. The power module of claim 20, wherein at least one of said first, second and third conducting layers includes a plurality of conducting regions that are electrically insulated from one another.

23. The power module of claim 20, wherein said multi-layer PCB further comprises a ground input, and wherein one of said plurality of insulated conducting regions is electrically connected to set ground input.

24. The power module of claim 23, wherein each power outlet in said power outlet group is configured as a receptacle that is mounted to said multi-layer PCB, and each receptacle including a neutral connector, a ground connector and line connector that extends through an associated one of said first, second and third conductively plated through holes.

25. A power module, comprising:
a multi-layer printed circuit board (PCB) comprising:
   a first conducting region;
   a second conducting region electrically insulated from the first conducting region;
   a third conducting region electrically insulated from the first and second conducting regions;
   at least a first input connection, at least a second input connection, and at least a third input connection each electrically connectable, respectively, to the first, second and third conducting regions; and
   a first conductively plated through hole extending through the first, second and third conducting regions, said first conductively plated through hole electrically connected to the first conducting region, and electrically insulated from the second and third conducting regions, and wherein the first conductively plated through hole receives a line connector associated with the at least a first power outlet and electrically interconnects the at least a first power outlet to the first input connection; and at least one outlet group, comprising:
   at least one first power outlet mounted on said PCB, and having an associated first power outlet line connector electrically connected to said first conducting region;
   at least one second power outlet mounted on said PCB, and having an associated second power outlet line connector electrically connected to said second conducting region; and
   at least one third power outlet mounted on said PCB, and having an associated third power output line connector electrically connected to said third conducting region,
wherein said first, second and third power outlets are arranged along a length of said PCB such that each adjacent pair of outlets is electrically connected to a different one of said first, second and third conducting regions.

26. The power module of claim 25, wherein said at least one first power outlet comprises a plurality of first power outlets mounted on said PCB, each having an associated first power outlet line connector electrically connected to said first conducting region;
said at least one second power outlet comprises a plurality of second power outlets mounted on said PCB, each having an associated second power outlet line connector electrically connected to said second conducting region; and
said at least one third power outlet comprises a plurality of third power outlets mounted on said PCB, each having an associated third power outlet line connector electrically connected to said third conducting region,
wherein said first, second and third power outlets are sequentially arranged along a length of said PCB as a plurality of outlet groups such that each adjacent pair of outlets is electrically connected to a different one of said first, second and third conducting regions.

27. The power module of claim 25, wherein said multi-layer PCB further comprises a second conductively plated through hole extending through the first, second and third conducting regions, said second conductively plated through hole electrically connected to the second conducting region, and electrically insulated from the first and third conducting region, and wherein the second conductively plated through hole receives a line connector associated with the at least a second power outlet and electrically interconnects the at least a second power outlet to the second input connection.

28. The power module of claim 27, wherein said multi-layer PCB further comprises a third conductive plated through hole extending through the first, second and third conducting regions, said third conductively plated through hole electrically connected to the third conducting region, and electrically insulated from the first and second conducting layers, and wherein the third conductively plated through hole receives a line connector associated with the at least a third power outlet and electrically interconnects the at least a third power outlet to the third input connection.

\* \* \* \* \*